United States Patent [19]

Funada

[11] Patent Number: 5,172,077
[45] Date of Patent: Dec. 15, 1992

[54] OSCILLATOR AND METHOD OF MANUFACTURING THE SAME

[75] Inventor: Yo Funada, Kyoto, Japan

[73] Assignee: Murata Manufacturing Co., Ltd., Japan

[21] Appl. No.: 874,176

[22] Filed: Apr. 24, 1992

[30] Foreign Application Priority Data

Apr. 27, 1991 [JP] Japan .................................. 3-124753

[51] Int. Cl.[5] .......................... H03B 1/00; H03B 5/18; H03B 7/12; H05K 9/00
[52] U.S. Cl. ...................................... 331/67; 331/96; 331/117 D; 331/107 SL; 361/399
[58] Field of Search ...................... 331/67, 68, 69, 96, 331/99, 117 R, 117 FE, 117 D, 107 SL; 361/399, 415; 333/246

[56] References Cited

U.S. PATENT DOCUMENTS 4,618,836 10/1986 Gannon et al. ........................ 331/96
4,736,069 4/1988 Mullins .............................. 331/67 X
5,053,730 10/1991 Kameya ........................... 333/246 X
5,089,794 2/1992 Norimatsu ............................. 331/68

FOREIGN PATENT DOCUMENTS 1329002 9/1973 United Kingdom .
2027278 2/1990 United Kingdom .
2237147 4/1991 United Kingdom .

Primary Examiner—David Mis
Attorney, Agent, or Firm—Ostrolenk, Faber, Gerb & Soffen

[57] ABSTRACT

In an oscillator employing a triplate type stripline, earth (ground) electrodes are formed only on an opposite pair of side surfaces of a substrate in which the stripline is embedded. An oscillation circuit mounted on the substrate is covered with a shielding case and the remaining side surfaces of the substrate, which are provided with no earth electrodes, are covered with shielding plates which are provided on the shielding case. Connecting portions of the shielding case are electrically connected with the earth electrodes by soldering. Thus, the stripline is electromagnetically shielded in a simple manner so that it is possible to easily manufacture an oscillator employing a stripline at a low cost.

10 Claims, 7 Drawing Sheets

OSCILLATOR AND METHOD OF MANUFACTURING THE SAME

BACKGROUND OF THE INVENTION

1. Field of the Invention

The present invention relates to an oscillator employing a stripline, and a method of manufacturing the same.

2. Description of the Background Art

FIG. 8 shows an exemplary conventional oscillator 1 employing a triplate type stripline 3. This oscillator 1 comprises a dielectric substrate 2 which is provided with the stripline 3 embedded therein and an oscillation circuit 4 which is mounted on the substrate 2 for inducing natural oscillation of the stripline 3. As shown in FIG. 9, two earth (ground) patterns 5 are formed in the interior and on the bottom surface of the substrate 2 respectively to hold the stripline 3, while earth electrodes 6 are formed on four side surfaces of the substrate 2 by printing or the like, and are electrically connected with the earth patterns 5. Thus, the earth patterns 5 and the earth electrodes 6 completely electromagnetically shield the periphery of the stripline 3, thereby reducing radiation loss of the stripline 3. An end (not shown) of the stripline 3 is connected to the earth patterns 5, while the other end (not shown) thereof is extended to the exterior of the substrate 2.

However, it is extremely difficult to form the earth electrodes 6 on the four side surfaces of the substrate 2, and hence the manufacturing cost is increased. When the substrate 2 is prepared from glass epoxy resin or the like, a large-area mother substrate 7 is generally cut into a plurality of substrates 2, as shown in FIG. 10. In this case, it is necessary to form the aforementioned earth electrodes 6 on respective of the plurality of substrates 2 cut end surfaces. Thus, the manufacturing cost is so increased that it is difficult to carry out such a method in practice.

SUMMARY OF THE INVENTION

Accordingly, an object of the present invention is to provide an oscillator employing a stripline which can simply electromagnetically shield the stripline, and a method of manufacturing the same.

The present invention is characterized in that, in an oscillator comprising a substrate which is provided with a stripline embedded therein, earth patterns formed to sandwich the stripline, an oscillation circuit which is mounted on the substrate and a shielding case covering the oscillation circuit, an earth electrode is formed on at least one side surface of the substrate to be electrically connected with the earth patterns, and the shielding case is electrically connected with the earth electrode, while the remaining side surfaces of the substrate are covered with shielding plates which are provided on the shielding case.

In such an oscillator, it is preferable that earth electrodes are formed on an opposite pair of side surfaces of the substrate, and that the shielding case for covering the oscillation circuit is provided with shielding plates for covering the remaining pair of side surfaces of the substrate, while the shielding case is electrically connected with the earth electrodes.

The present invention is also directed to a method of manufacturing an oscillator comprising a substrate which is provided with a stripline embedded therein and earth patterns formed to sandwich the stripline, and an oscillation circuit which is mounted on the substrate. This method comprises a step of preparing a mother substrate which can provide a plurality of substrates each being provided with the stripline embedded therein and earth patterns formed to sandwich the stripline, a step of forming through holes along first cut portions which defines opposite pairs of side surfaces of the substrates, to be provided with earth electrodes, among the cut portions which define the substrates from within the mother substrate, a step of forming metal films at least on the inner surfaces of the through holes, a step of cutting the mother substrate along the cut portions for dividing the through holes provided with the metal films and preparing a plurality of substrates being provided with earth electrodes on the opposite pairs of side surfaces, a step of mounting an oscillation circuit on each of the substrates, and a step of covering the oscillation circuit with a shielding case while covering the remaining side surfaces of the substrate, which are provided with no earth electrodes, with shielding plates provided on the shielding case, and electrically connecting the shielding case with the earth electrodes.

According to the inventive oscillator, the earth electrodes are electrically connected with the earth patterns while the shielding plates are electrically connected with the earth electrodes, to be at the same potentials as the earth patterns. Thus, the stripline is enclosed and electromagnetically shielded by the earth electrodes, the shielding plates and the earth patterns, which are at the same potentials with each other. Therefore, radiation loss of the stripline is reduced.

When earth electrodes are formed on a pair of opposite side surfaces of the substrate and electrically connected with the earth patterns, while the remaining side surfaces of the substrate are covered with shielding plates provided on the shielding case which is electrically connected with the earth electrodes, the stripline is enclosed and electromagnetically shielded by the earth electrodes, the shielding plates and the earth patterns, which are at the same potentials with each other. Further, the oscillation circuit is covered with and electromagnetically shielded by the shielding case.

According to the inventive method of manufacturing an oscillator, on the other hand, through holes are formed in prescribed positions of the mother substrate, and metal films are formed on the inner surfaces of the through holes. Then, the mother substrate is cut along the cut portions, to provide a plurality of substrates. At this time, the through holes provided with the metal films are divided so that earth electrodes are formed on opposite pairs of side surfaces of the substrates. Then, an oscillation circuit is mounted on each substrate, and covered with a shielding case. On the other hand, the remaining side surfaces of the substrate, which are provided with no earth electrodes, are covered with shielding plates which are provided on the shielding case. The shielding case is electrically connected with the earth electrodes, so that the four side surfaces of the substrate are covered with and electromagnetically shielded by the earth electrodes which are formed by the metal films and the shielding plates which are provided on the shielding case, while the oscillation circuit mounted on the substrate is covered with and electromagnetically shielded by the shielding case, whereby a completely electromagnetically shielded oscillator is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
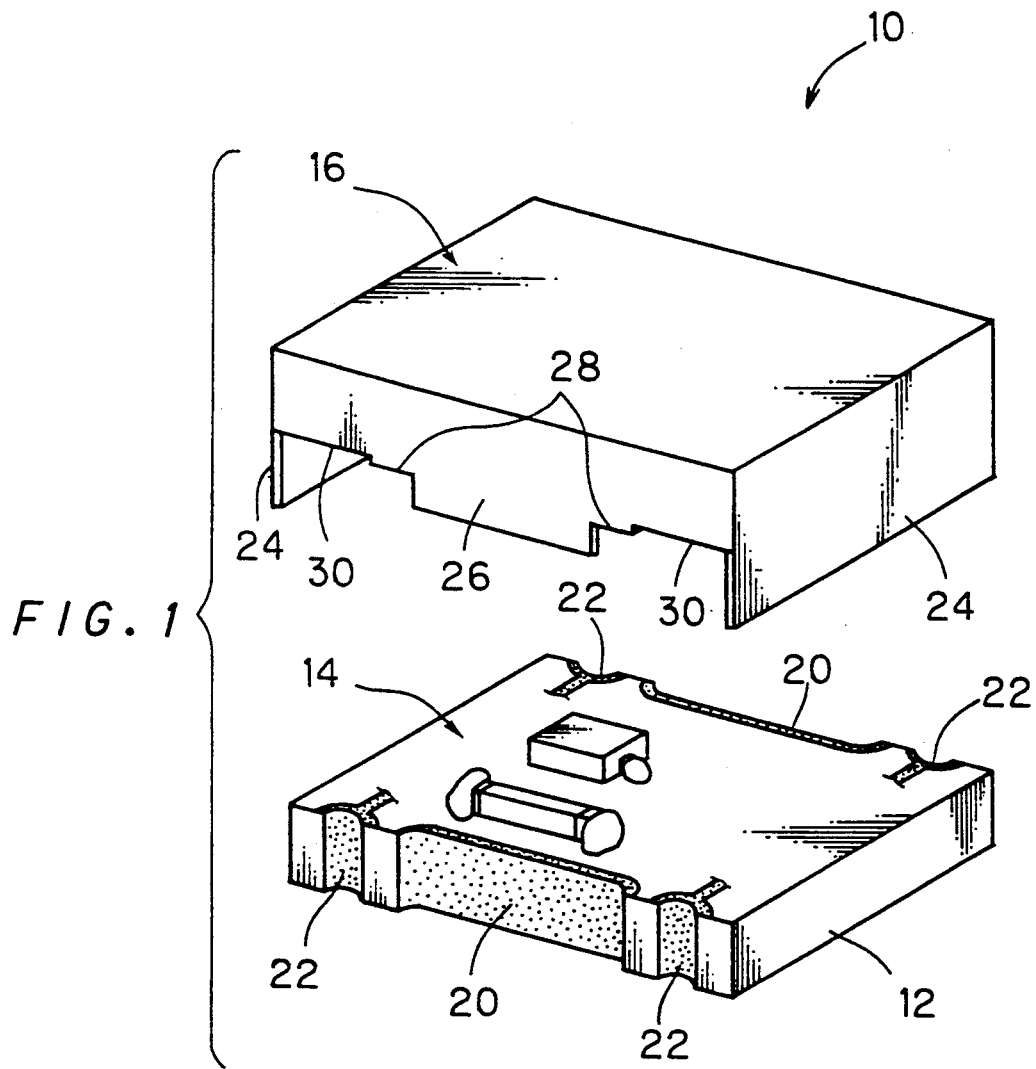
FIG. 1 is an exploded perspective view showing an embodiment of an oscillator according to the present invention.
Figure 2:
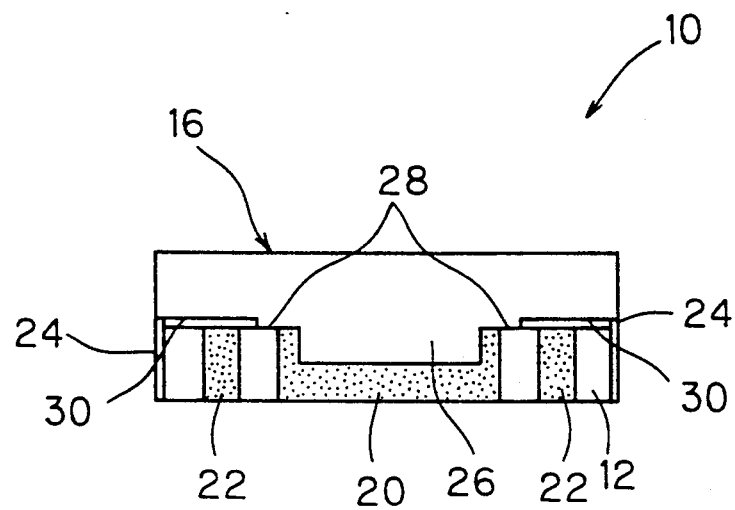
FIG. 2 is a front elevational view of the oscillator shown in FIG. 1.
Figure 9:
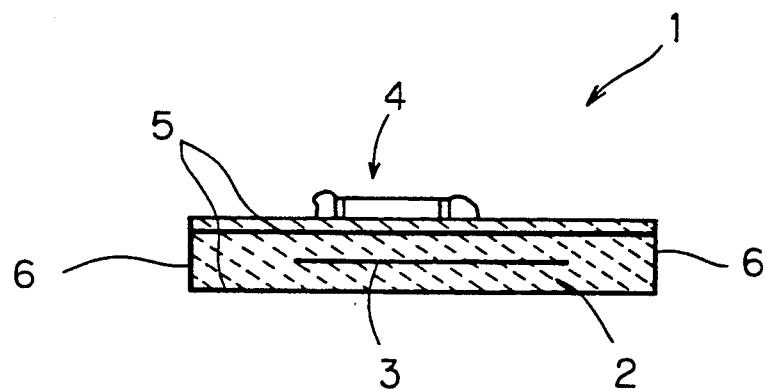
FIG. 9 is a sectional view of the oscillator shown in FIG. 8.
Figure 10:
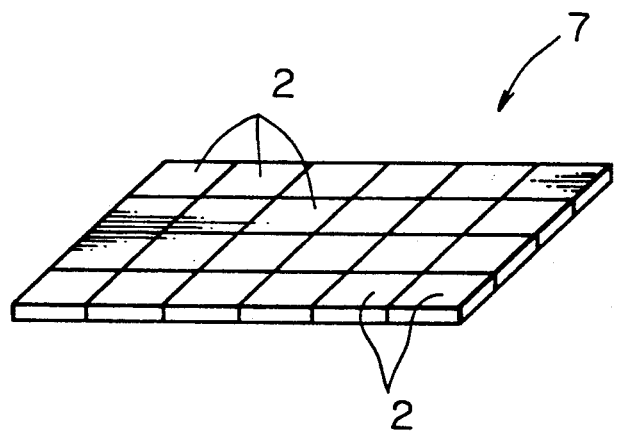
FIG. 10 is a perspective view showing a mother substrate which is employed in a method of manufacturing the oscillator shown in FIGS. 8 and 9.

FIGS. 1 and 2 illustrate an oscillator 10 according to an embodiment of the present invention, which employs a triplate type stripline (not shown) similar to that shown in FIG. 9. The oscillator 10 comprises a substrate 12 of glass epoxy resin or the like, which is provided with the stripline embedded therein, an oscillation circuit 14 which is mounted on the substrate 12, and a shielding case 16 covering the oscillation circuit 14 and other components.

Figure 3:
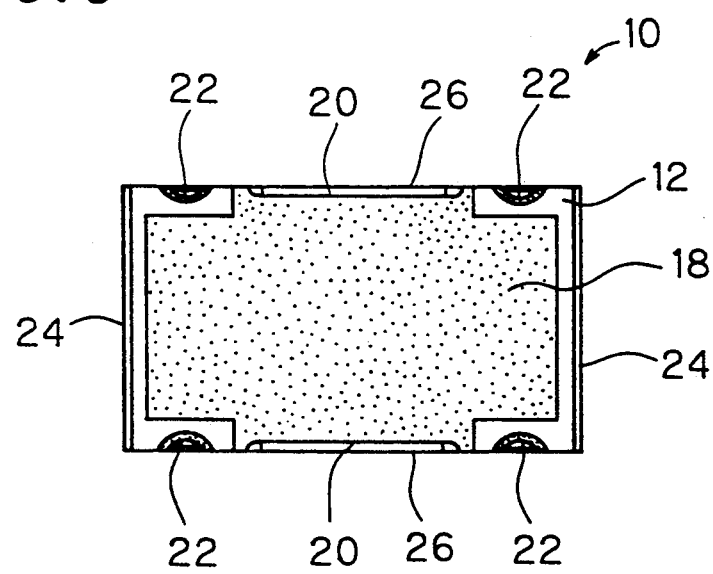
FIG. 3 is a bottom plan view of the oscillator shown in FIGS. 1 and 2.

FIG. 3 shows an earth pattern 18, which is provided on the bottom surface of the substrate 12 to sandwich the stripline together with another earth pattern (not shown in the figure but denoted by reference numeral 18' in the following description for the purpose of convenience) which is provided in the interior of the substrate 12. The substrate 12 is further provided on its opposite side surfaces with cavities, which are covered with metal films of tin, copper, silver or solder to define earth electrodes 20 and terminal electrodes 22. The earth electrodes 20 are electrically connected with the earth patterns 18' and 18 which are provided in the interior and on the bottom surface of the substrate 12 respectively, to be entirely at the same potentials with each other. On the other hand, the terminal electrodes 22 are electrically connected with a printed wire (not shown) which is formed on the surface of the substrate 12, to be connected to an external power source and for connecting the output of the oscillator 10 to the exterior.

On the other hand, shielding plates 24 are provided on side portions of the shielding case 16 in order to cover the remaining side surfaces of the substrate 12, which are provided with no earth electrodes 20. Further, connecting portions 26 protrude from the side portions of the shielding case 16, which are provided with no shielding plates 24, to be engaged with the cavities provided with the earth electrodes 20 and electrically connected with the earth electrodes 20 by soldering or the like. Thus, the shielding case 16 is entirely at the same potential as the earth electrodes 20 and the earth patterns 18 and 18'. The earth electrodes 20 are formed in the cavities provided on the side surfaces of the substrate 12 and the connecting portions 26 of the shielding case 16 are engaged with such cavities, whereby the connecting portions 26 will not protrude from the side surfaces of the substrate 12 and the appearance of the oscillator 1 can be improved. Further, stopper portions 28 are provided on both sides of the connecting portions 26 to come into contact with the upper surface of the substrate 12, thereby ensuring a space for storing the oscillation circuit 14 while so positioning the shielding case 16 and the substrate 12 as to simplify assembling of the oscillator. In addition, steps 30 are formed in positions adjacent to the stopper portions 28, to prevent the shielding case 16 and the terminal electrodes 22 from shorting. The shielding case 16 is formed by shaping a metal plate of copper or aluminum, for example. The shielding case 16 may alternatively be prepared from a resin material which is plated with a metal or the like, or mixed with conductive power.

Thus, the stripline embedded in the substrate 12 is enclosed and electromagnetically shielded by the earth electrodes 20, the shielding plates 24 and the earth patterns 18 and 18' which are at the same potentials with each other, whereby radiation loss of the stripline is reduced.

An embodiment of a method of manufacturing the oscillator 10 is now described.

Figure 4:
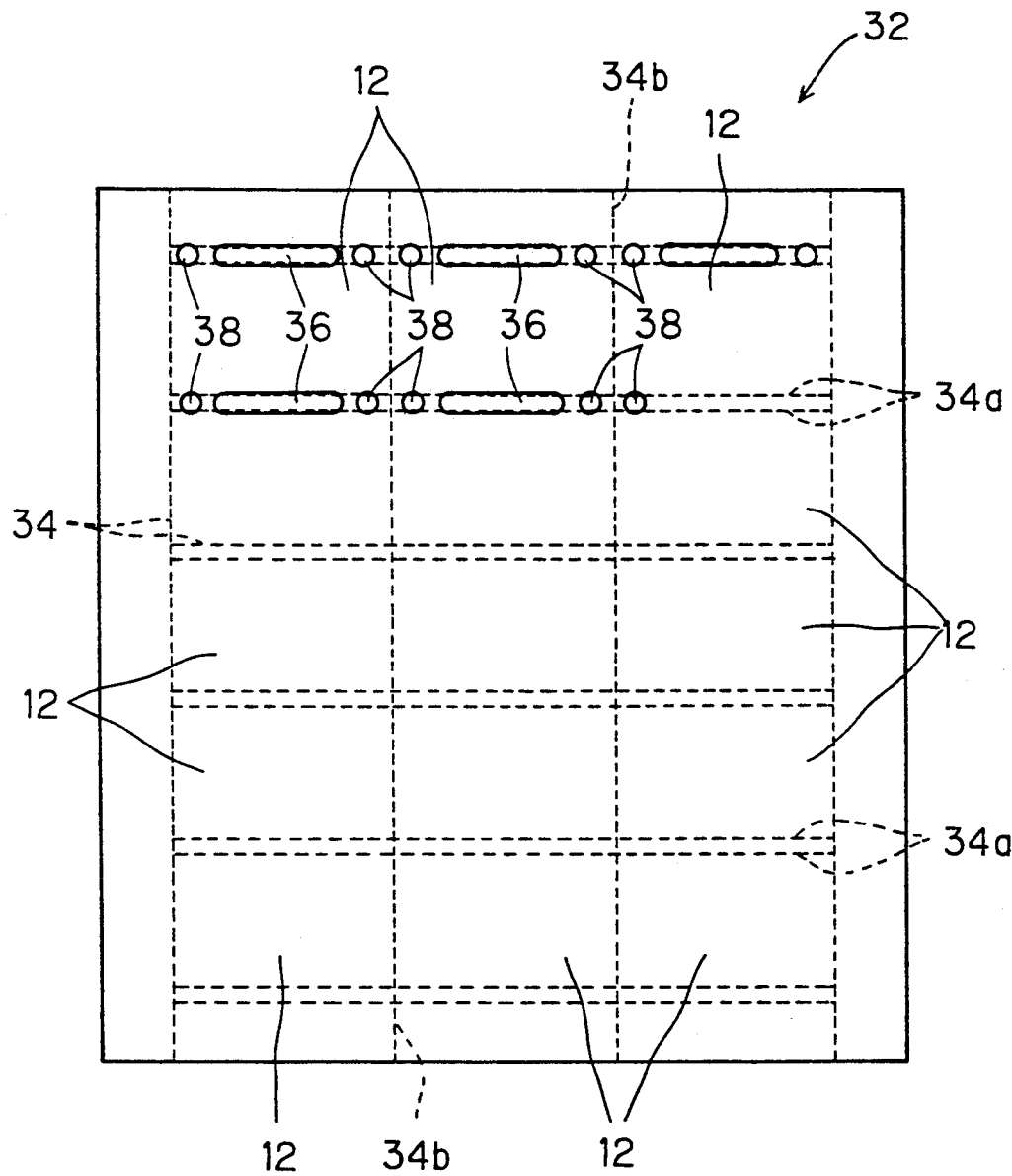
FIG. 4 is a plan view showing a mother substrate which is employed for an embodiment of a method of manufacturing an oscillator according to the present invention.

As shown in FIG. 4, a mother substrate 32 is prepared to be vertically and transversely cut along cut portions 34 for providing a plurality of substrates 12. A plurality of striplines (not shown) are embedded in prescribed positions of the mother substrate 32, while pairs of earth patterns are formed to hold the striplines respectively. First ones of such pairs of earth patterns are provided in the interior of the mother substrate 32, while second ones are provided on the bottom surface of the mother substrate 32.

Then, oval holes 36 and round holes 38 are formed to pass through the mother substrate 32 in prescribed positions along first cut portions 34a, which are adapted to define side surfaces provided with the earth electrodes 20 and the terminal electrodes 22, among the cut portions 34. Although FIG. 4 illustrates the oval and round holes 36 and 38 only on specific ones of the first cut portions 34a, such oval and round holes 36 and 38 are successively formed on all these cut portions 34a by prescribed means.

Then, metal films are formed on the inner surfaces of the oval and round holes 36 and 38. Such metal films can be formed by a method of plating metal films with a well-known known through hole forming technique, a method of applying conductive paste, or the like, for example.

Figure 5:
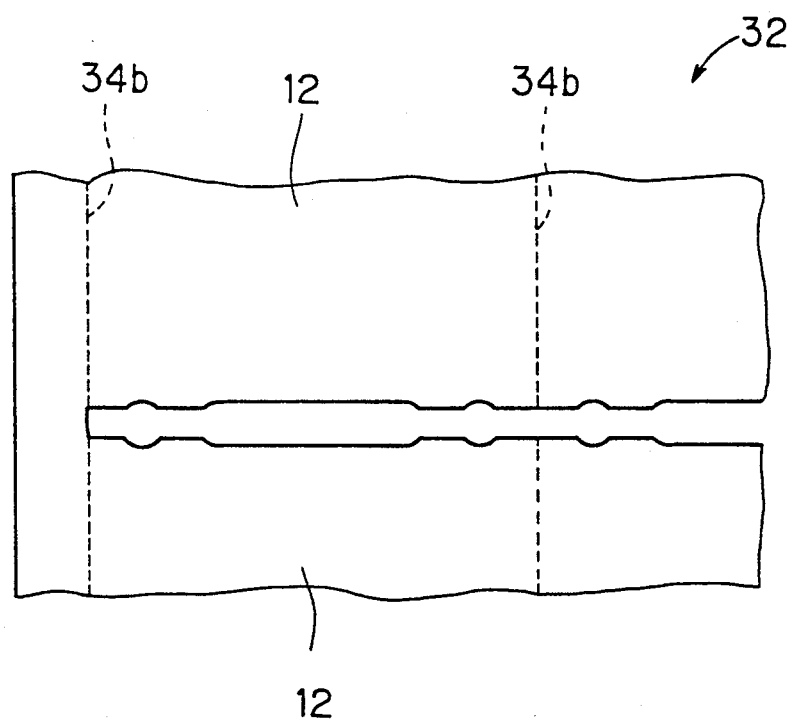
FIG. 5 is a partially enlarged plan view of the mother substrate shown in FIG. 4.

Then, spaces between the oval and round holes 36 and 38 are punched or cut out with a press or the like to divide the metal films formed therein as shown in FIG. 5, thereby forming the earth electrodes 20 and the terminal electrodes 22. Further, the mother substrate 32 is vertically cut along second cut portions 34b to provide a plurality of substrates 12, each of which is provided with the stripline embedded therein, the earth patterns 18 and 18' holding the stripline, and the earth electrodes 20 and the terminal electrodes 22 formed on the side surfaces, as shown in FIG. 1.

Then, the oscillation circuit 14 is mounted on each substrate 12 and covered with the shielding case 16, while the side surfaces of the substrate 12 are covered with the shielding plates 24. Thereafter the connecting portions 26 of the shielding case 16 are soldered to the earth electrodes 20. Thus, the surfaces of the substrate 12 provided with no earth electrodes 20 are covered with the shielding plates 24 which are provided on the shielding case 16, so that the stripline embedded in the substrate 12 is electromagnetically shielded by the earth patterns 18 and 18', the earth electrodes 20, and the shielding plates 24 of the shielding case 16 electrically connected therewith, while the oscillation circuit 14 mounted on the substrate 12 is also electromagnetically shielded by the shielding case 16, to obtain the inventive oscillator 10.

According to this method, the oscillator 10 can be extremely easily manufactured as compared with the conventional method of forming earth electrodes on four side surfaces of the substrate by printing or the like. Further, the mother substrate 32 is cut to simultaneously manufacture a plurality of substrates 12 with excellent efficiency, whereby the manufacturing cost can be remarkably reduced.

Although the oscillator and the method of manufacturing the same according to the present invention have been described in detail, the present invention is not restructed to the aforementioned embodiments, but various modifications are available.

Figure 6:
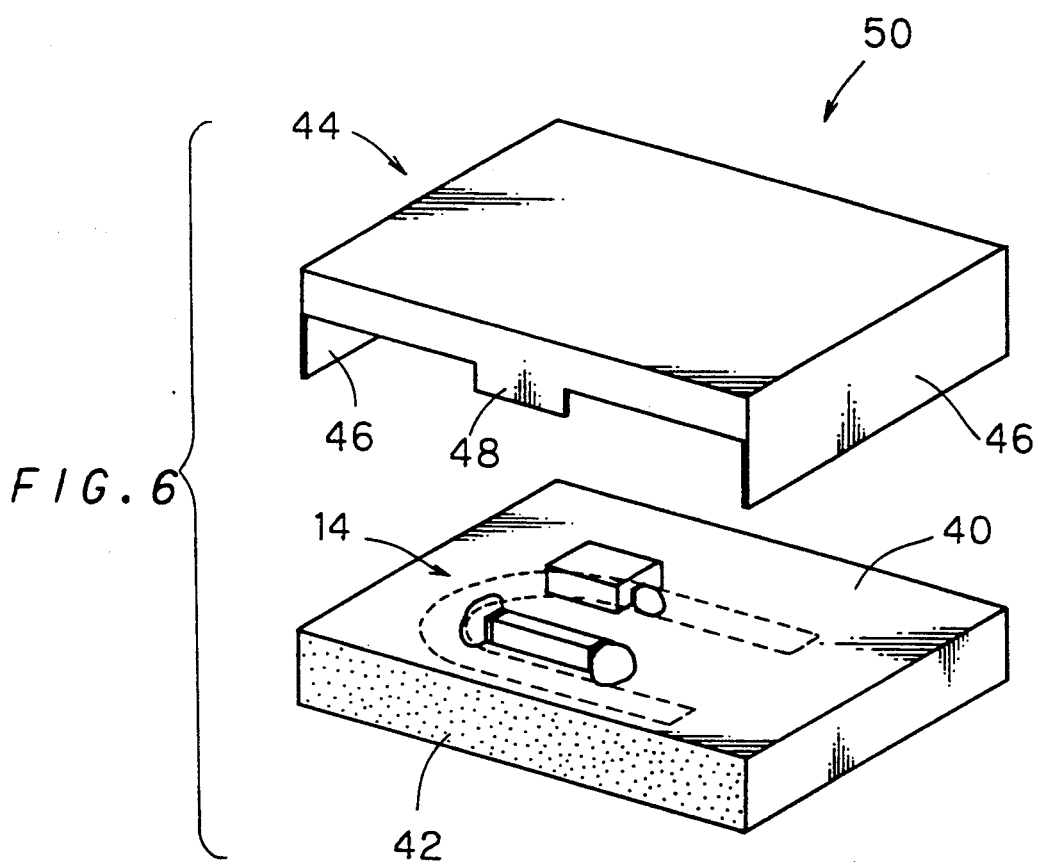
FIG. 6 is an exploded perspective view showing a second embodiment of an oscillator according to the present invention.

For example, FIG. 6 shows an oscillator 50 according to another embodiment of the present invention. In the oscillator 50 shown in FIG. 6, earth electrodes 42 are formed entirely over a pair of opposite side surfaces of a substrate 40 and a surface provided with an oscillation circuit 14 is covered with a shielding case 44, while the remaining side surfaces of the substrate 40 provided with no earth electrodes 42 are covered with shielding plates 46 which are provided on the shielding case 44. Connecting portions 48 of the shielding case 44 are electrically connected with the earth electrodes 42 by soldering or the like. The oscillator 50 according to this embodiment is connected to an external printed board or the like by lead terminals (not shown) which pass through the substrate 40.

Figure 7:
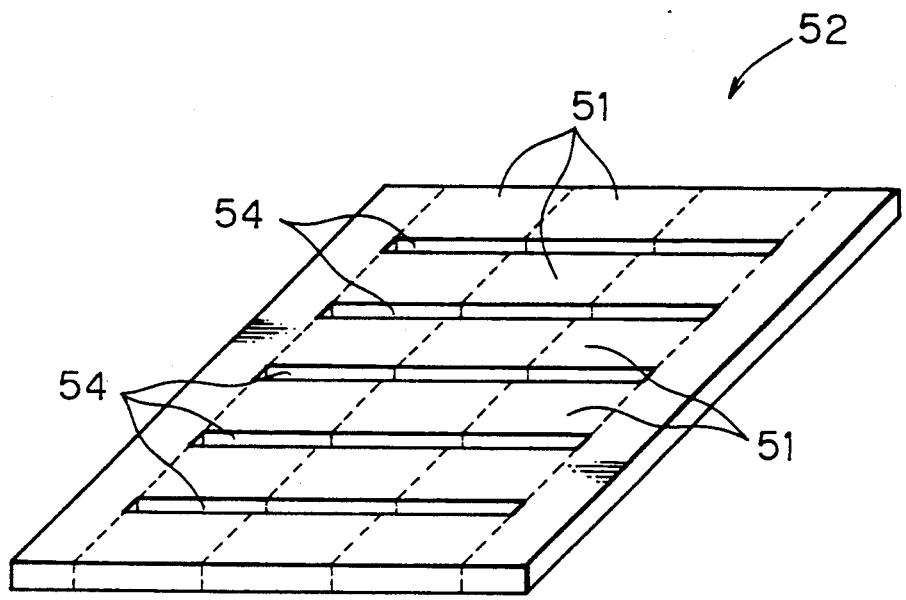
FIG. 7 is a perspective view showing a mother substrate which is employed for an embodiment of a method of manufacturing the second oscillator according to the present invention.
Figure 8:
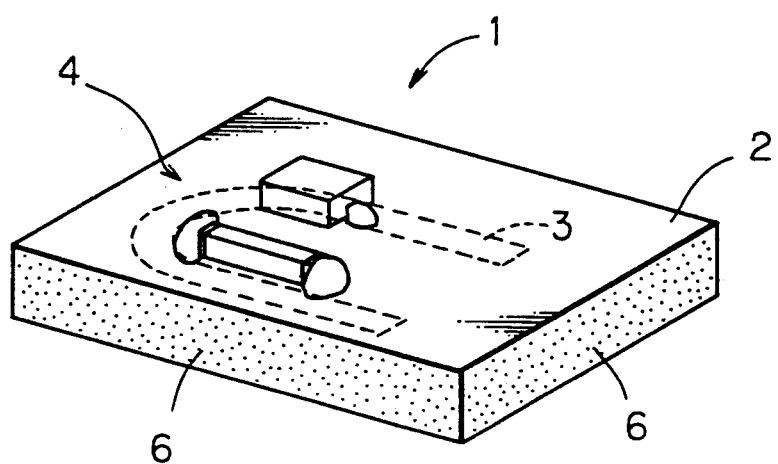
FIG. 8 is a perspective view showing a conventional oscillator.

It is possible to manufacture such an oscillator 50, which is provided with the earth electrodes 42 entirely over the opposite pair of side surfaces, by the following method, for example: As shown in FIG. 7, a mother substrate 52 is prepared to be capable of providing a plurality of substrates 51, and slit-type through holes 54 are formed along cut portions for defining opposite side surfaces of the substrates 51. Then metal films are formed on the inner surfaces of the through holes 54 by application of conductive paste or the like. Thereafter the mother substrate 52 is vertically cut to prepare the substrates 51, each of which is provided with the earth electrodes 42 entirely over the opposite pair of side surfaces.

When the mother substrate 32 is prepared from resin such as glass epoxy resin in the aforementioned embodiment, it is preferable to punch the spaces between the oval and round holes 36 and 38 by means of a press or the like so that the spaces have constant widths. When the mother substrate 32 is prepared from a ceramic material, on the other hand, it is preferable to linearly cut such spaces substantially with no widths.

Further, printed conductors may be formed on the surface of the mother substrate before the through holes are formed in the mother substrate. Or, such through holes may be first formed in the mother substrate, and then the metal films may be formed on the inner surfaces of the through holes and printed conductors are simultaneously formed on the mother substrate. Thus, the printed conductors can be formed in any arbitrary stage before mounting of electronic parts forming the oscillation circuits.

Alternatively, the earth electrode may be formed only on one side surface of the substrate, the remaining three side surfaces being covered with a metal member, which is formed by coupling shielding plates in a U shape, and which in turn is electrically connected with the earth electrode.

In the oscillator according to the present invention, as hereinabove described, the earth electrode is formed on at least one side surface of the substrate and electrically connected with the earth patterns in the substrate. The shielding case is electrically connected with the earth electrodes and the remaining side surfaces are covered with the shielding plates which are provided on the shielding case, whereby the stripline embedded in the substrate can be electromagnetically shielded in a simple manner. That is, the earth electrode may be formed on only one side surface of the substrate, whereby the oscillator can be easily manufactured at a low cost. Since the stripline is electromagnetically shielded to an extent substantially similar to that of the prior art, it is possible to attain performance substantially similar to that of the conventional oscillator.

When earth electrodes are formed on an opposite pair of side surfaces of the substrate and the remaining side surfaces are covered with shielding plates provided on the shielding case, the earth electrodes may be formed only on the opposite pair of side surfaces of the substrate, whereby the oscillator can be easily manufactured at a low cost. Since the oscillation circuit is covered with and electromagnetically shielded by the shielding case, no electromagnetic noise generated from the oscillation circuit leaks to the exterior, and no malfunction is caused in the oscillation circuit by electromagnetic noise received from the exterior.

In the method of manufacturing an oscillator according to the present invention, through holes are formed at prescribed positions in a mother substrate and metal films are formed on the inner surfaces of the through holes to form earth electrodes on an opposite pair of side surfaces of each substrate. Thus, it is possible to extremely easily manufacture an oscillator at a low cost.

Although the present invention has been described and illustrated in detail, it is clearly understood that the same is by way of illustration and example only and is not to be taken by way of limitation, the scope of the present invention being limited only by the terms of the appended claims.

What is claimed is:

1. An oscillator comprising:
   a substrate provided with a stripline embedded in its interior and ground patterns being formed to sandwich said stripline;
   an oscillation circuit mounted on said substrate and electrically connected to said stripline; and
   a shielding case on said substrate covering said oscillation circuit, wherein:

a ground electrode is formed on at least one side surface of said substrate and is electrically connected with said ground patterns, said shielding case is electrically connected with said ground electrode, and at least one remaining side surface of said substrate is covered with a shielding plate provided on said shielding case.

2. An oscillator in accordance with claim 1, wherein said substrate has four sides, said ground electrodes are formed on an opposite pair of side surfaces of said substrate, said shielding case is provided with said shielding plates for covering the remaining pair of side surfaces of said substrate, and said shielding case is electrically connected with said ground electrodes.

3. An oscillator in accordance with claim 1, wherein a first cavity is formed on said at least one side surface of said substrate provided with said ground electrode and said ground electrode is formed in said cavity, and said shielding case is provided with a downwardly depending connecting portion which is electrically connected with said ground electrode provided in said cavity.

4. An oscillator in accordance with claim 3, wherein said shielding case is provided with stopper portions adjacent said connecting portion which come into contact with one major surface of said substrate on both sides of said connecting portion for defining the relative positions of the connecting portion and the ground electrode.

5. An oscillator in accordance with claim 3, wherein a second cavity is formed on said side surface of said substrate which is provided with said ground electrode, independently of said first cavity, and a terminal electrode electrically connected to said oscillation circuit is formed in said second cavity.

6. An oscillator in accordance with claim 3, wherein a pair of first cavities are formed respectively on said opposite pair of side surfaces of said substrate provided with said ground electrodes and said ground electrodes are formed in said cavities, and said shielding case is provided with downwardly depending connecting portions which are respectively electrically connected with said ground electrodes provided in said first cavities.

7. An oscillator in accordance with claim 6, wherein said shielding case is provided with stopper portions adjacent both said connecting portions, which come into contact with one major surface of said substrate on both sides of both said connecting portions for defining the relative positions of the connecting portions and the ground electrodes.

8. An oscillator in accordance with claim 6, wherein at least a pair of second cavities are formed respectively on said side surfaces of said substrate which are provided with said ground electrodes, independently of said first cavities, and a terminal electrode is formed in each of said second cavities.

9. A method of manufacturing an oscillator comprising a substrate provided with a stripline embedded therein and ground patterns being formed to sandwich said stripline, and an oscillation circuit electrically connected to the stripline being mounted on said substrate, said method comprising the steps of:

preparing an mother substrate capable of providing a plurality of individual substrates each provided with said stripline embedded therein and said ground patterns being formed to sandwich said stripline;

defining cut lines on said mother substrate for being cut to provide said individual substrates, said cut lines including first and second cut lines for defining respective first and second opposite pairs of side surfaces of said individual substrates, said first cut lines defining side surfaces to be provided with ground electrodes;

forming through holes along said first cut lines;

forming metal films on the inner surfaces of said through holes;

cutting said mother substrate along said first and second cut lines for dividing said through holes provided with said metal films so as to provide a plurality of individual substrates provided with said ground electrodes on said first opposite pairs of side surfaces;

mounting an oscillation circuit on each said individual substrate; and covering said oscillation circuit with a shielding case, including covering said second side surfaces of said substrate, which are provided with no ground electrodes, with shielding plates provided on said shielding case, and electrically connecting said shielding case with said ground electrodes.

10. A method in accordance with claim 9, further comprising the step of:

forming second through holes along said first cut lines, and metal films on the inner surfaces of said second through holes, whereby the step of cutting along said first cut lines provides respective terminal electrodes on said first opposite pairs of side surfaces of said individual substrates.

* * * * *